US 6,896,969 B2

(12) United States Patent
Reinberg

(10) Patent No.: US 6,896,969 B2
(45) Date of Patent: *May 24, 2005

(54) OXIDATIVE CONDITIONING COMPOSITIONS FOR METAL OXIDE LAYER AND APPLICATIONS THEREOF

(75) Inventor: Alan R. Reinberg, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/781,148

(22) Filed: Feb. 17, 2004

(65) Prior Publication Data

US 2004/0166672 A1 Aug. 26, 2004

Related U.S. Application Data

(60) Continuation of application No. 10/158,650, filed on May 29, 2002, which is a division of application No. 08/989,694, filed on Dec. 12, 1997, now Pat. No. 6,432,793.

(51) Int. Cl.[7] .............................. B32B 15/04; B32B 9/00
(52) U.S. Cl. ....................... 428/446; 428/336; 428/450; 428/469; 428/697; 428/699; 428/701; 428/702; 428/704
(58) Field of Search .............................. 428/446, 469, 428/689, 697, 699, 701, 702, 336, 450, 704

(56) References Cited

U.S. PATENT DOCUMENTS

| 4,002,542 A | 1/1977 | Young ....................... 204/38 A |
| 4,002,545 A | 1/1977 | Fehiner et al. ............... 204/192 |
| 4,038,167 A | 7/1977 | Young ..................... 204/192 D |
| 4,062,749 A | 12/1977 | Young ................... 204/192 SP |
| 4,089,039 A | 5/1978 | Young ......................... 361/322 |
| 4,413,061 A | 11/1983 | Kumar et al. ................... 501/7 |
| 4,778,536 A | 10/1988 | Grebinski ..................... 134/36 |
| 4,888,208 A | * 12/1989 | Maeda et al. ................. 427/96 |
| 5,037,506 A | 8/1991 | Gupta et al. ................. 438/706 |
| 5,111,355 A | 5/1992 | Anand et al. ................. 361/313 |
| 5,119,274 A | 6/1992 | Kinuta et al. ............... 361/525 |
| 5,142,438 A | 8/1992 | Reinberg et al. ............ 361/313 |
| 5,185,689 A | 2/1993 | Maniar ....................... 361/313 |
| 5,189,503 A | 2/1993 | Suguro et al. .............. 257/310 |
| 5,195,018 A | 3/1993 | Kwon et al. ................. 361/313 |
| 5,439,840 A | 8/1995 | Jones, Jr. et al. ............. 437/52 |
| 5,457,065 A | 10/1995 | Huang et al. ................. 437/60 |
| 5,468,687 A | 11/1995 | Carl et al. .................... 437/235 |
| 5,504,021 A | 4/1996 | Hong et al. ................... 437/42 |
| 5,552,337 A | 9/1996 | Kwon et al. .................. 437/60 |
| 5,578,850 A | 11/1996 | Fitch et al. ................. 257/329 |

(Continued)

FOREIGN PATENT DOCUMENTS

| JP | 63100091 A | 5/1988 | ........... C04B/41/88 |
| JP | 63117485 A | 5/1988 | ............ B05D/3/04 |

OTHER PUBLICATIONS

Cathey, Jr., "Field Emission Displays," International Synposium on VLSI Technology Systems, and Applications, Proceedings of Technical Papers, May 31–Jun. 2, 1995, Taipei, Taiwan, 1995, pp 131–136.

Saitoh et al., "Electrical Properties of Thin $Ta_2O_5$ Films Grown by Chemical Vapor Deposition," in *IEEE International Electron Devices Meeting*, Los Angeles, CA, Dec. 7–10, 1986, pp 680–683.

Primary Examiner—Stephen Stein
(74) Attorney, Agent, or Firm—Dorsey & Whitney LLP

(57) ABSTRACT

A metal oxide layer may made more highly oxidized by exposing the layer to sulfur trioxide. The leakage current of the layer may thereby be decreased, providing a capacitor containing such a layer with improved performance properties. The capacitor may be incorporated into a dynamic random access memory cell or other structure useful in the semiconductor or other industry.

21 Claims, 1 Drawing Sheet

U.S. PATENT DOCUMENTS

| | | |
|---|---|---|
| 5,583,068 A | 12/1996 | Jones, Jr. et al. ............. 437/52 |
| 5,591,664 A | 1/1997 | Wang et al. ................... 437/60 |
| 5,607,874 A | 3/1997 | Wang et al. ................... 437/52 |
| 5,612,241 A | 3/1997 | Arima .......................... 437/52 |
| 5,612,574 A | 3/1997 | Summerfelt et al. ........ 257/783 |
| 5,851,892 A | 12/1998 | Lojek et al. ................. 438/305 |
| 5,972,052 A | 10/1999 | Koayashi et al. .......... 29/25.03 |
| 6,351,370 B1 | 2/2002 | Konuma et al. ............ 361/523 |
| 6,432,793 B1 | 8/2002 | Reinberg .................... 438/396 |

* cited by examiner

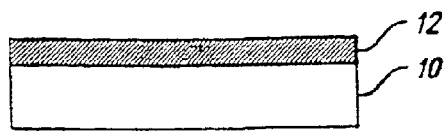
Fig. 1
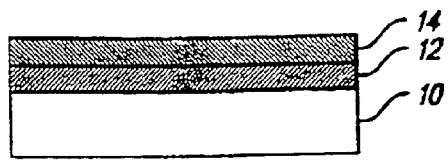
Fig. 2
Fig. 3
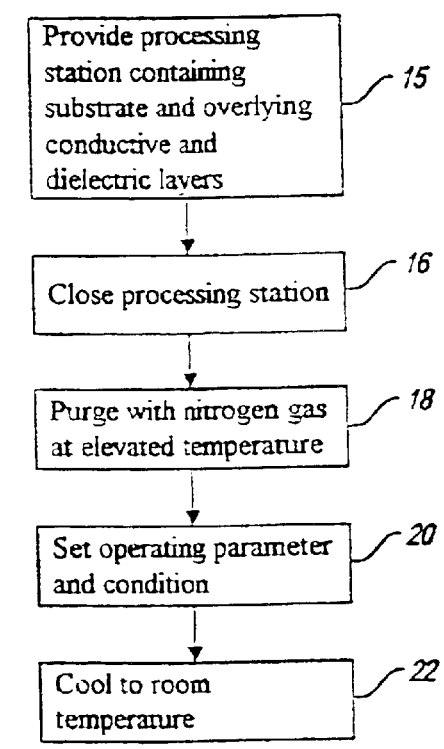
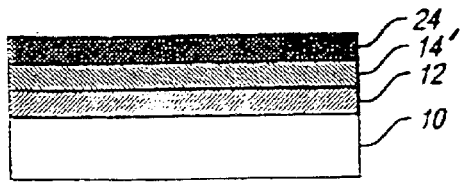
Fig. 4

OXIDATIVE CONDITIONING COMPOSITIONS FOR METAL OXIDE LAYER AND APPLICATIONS THEREOF

CROSS-REFERENCE TO RELATED APPLICATION

This application is a continuation of U.S. patent application Ser. No. 10/158,650, filed May 29, 2002; which is a divisional of U.S. patent application Ser. No. 08/989,694, filed Dec. 12, 1997, which issued as U.S. Pat. No. 6,432,793.

FIELD OF THE INVENTION

This invention relates generally to electronic devices, and more specifically to a method for conditioning a substoichiometric metal oxide dielectric layer of a capacitor useful in semiconductor devices such as dynamic random access memories (DRAMs).

BACKGROUND OF THE INVENTION

As semiconductor manufacturing technology has progressed and the applications of memory devices have expanded, numerous highly integrated memory devices have been developed. One such memory device is dynamic random access memory (DRAM). In general, DRAM consists of an array of memory cells which are accessed by peripheral circuitry that randomly reads and writes information to and from individual memory cells. The most common type of DRAM cell consists of a single transistor and a single capacitor connected in series. The capacitor stores a bit of data as an electrical charge, and the transistor allows for selective charging and discharging of the capacitor.

A capacitor, in its simplest form, consists of two conducting electrode surfaces separated by an insulating dielectric material. In the early development of the semiconductor capacitor, a doped substrate was used as the first electrode, silicon dioxide was used as the dielectric material, and a metal layer was used as the second electrode. More recently, and due to technological advances, the capacitor electrodes are now commonly made from materials such as polysilicon, epitaxial silicon, silicides, salicides, as well as several metals including osmium, rhodium, platinum, gold, ruthenium, and aluminum, while the capacitor dielectric is now commonly made from materials such as oxide-nitride-oxide (ONO), tantalum pentoxide, and lead zirconium titanate.

Among these new dielectric materials, tantalum pentoxide is perhaps the most widely studied and commercially developed. Tantalum pentoxide is an advantageous capacitor dielectric material because it has a dielectric constant which is approximately six to eight times greater than that of silicon dioxide. Thus, as the size of memory cells shrink, the capacitance can be maintained at a high level needed for device performance. Because of the demand for denser and more highly integrated memory devices, smaller DRAM cells are very desirable.

A problem exists, however, with the electrical characteristics of metal oxide dielectric layers applied by most conventional semiconductor processing techniques. Typically, metal oxide is applied to a first capacitor electrode of a semiconductor device by either chemical vapor deposition (CVD) or by sputtering. Both of these techniques, however, result in a metal oxide layer which tends to be oxygen deficient. That is, the ratio of oxygen to metal atoms tends to be lower than the metal oxide's stoichiometric ratio; hence, the metal oxide dielectric layer prepared by either of these two conventional techniques will be substoichiometric. A substoichiometric metal oxide dielectric layer has a higher leakage current and a lower breakdown voltage than a fully oxidized or stoichiometric metal oxide dielectric layer. Until recently, these undesirable electrical characteristics associated with substoichiometric metal oxide layers have limited their use as capacitor dielectrics in DRAM cells.

The literature discloses several methods which seek to improve the undesirable electrical characteristics of one type of metal oxide dielectric layer, namely, tantalum pentoxide. For example, rapid thermal oxidation (RTO), ultraviolet (UV) ozone, and low temperature ozone plasma annealing of a tantalum pentoxide dielectric layer have all been reported. These methods all attempt to more fully oxidize a substoichiometric tantalum pentoxide layer into a fully or substantially stoichiometric composition. A discussion of these methods is provided in U.S. Pat. No. 5,468,687 issued to Carl et al., and in U.S. Pat. No. 5,142,438 issued to Reinberg et al. There are, however, several disadvantages associated with each of these methods. For example, the rapid thermal oxidation method utilizes high temperatures which can damage the underlying semiconductor substrate, including the substrate's various components. Specifically, the high temperatures used in this method have been found to damage the underlying polysilicon conductive layer, thereby degrading the capacitor's dielectric properties. Similarly, the ultraviolet ozone method has been found to induce local regions of high temperature which can also damage the polysilicon conductive layer. Finally, although the low temperature ozone plasma annealing method is performed at low temperatures (i.e., approximately 400° C.) and is therefore not damaging to the underlying polysilicon conductive layer, it nevertheless requires relatively sophisticated and expensive processing equipment.

Another method that the literature discloses to improve the electrical properties of a tantalum pentoxide layer is to dope it with titanium dioxide. A discussion of tantalum pentoxide doping and its limitations is provided in U.S. Pat. No. 5,189,503 issued to Suguro et al, and in an article entitled "Electrical Properties of Thin $Ta_2O_5$ Films Grown by Chemical Vapor Deposition", at pp. 680–683 of the IEDM Technical Digest (1986), by Saito et al. The primary limitation with doping tantalum pentoxide with titanium dioxide is that it only partially solves the oxygen deficiency problem due to solubility limitations of titanium. As a result, tantalum pentoxide doped with titanium dioxide still has a higher than desired leakage current.

Accordingly, there exists a need for a method to fully oxidize a substoichiometric metal oxide dielectric layer, such as tantalum pentoxide, into a stoichiometric composition in a practical and effective manner. The present invention fulfills this need by providing a new low temperature method for conditioning a metal oxide layer to form a more highly oxidized layer, and provides further related advantages as disclosed in more detail herein.

SUMMARY OF THE INVENTION

In a first aspect, the invention provides a method of forming a memory cell. The method includes the step of providing a substrate having a transistor on a first portion of the substrate and a first conductive layer on a second portion of the substrate. The transistor has a first electrode. The method further includes the step of forming a dielectric layer containing substoichiometric tantalum pentoxide having a first oxygen content, the dielectric layer overlying the first conductive layer; conditioning the dielectric layer with sulfur trioxide to define a more highly oxidized tantalum pentoxide layer having a second oxygen content, where the second oxygen content is greater than the first oxygen content; forming a second conductive layer overlying the more highly oxidized tantalum pentoxide layer; and coupling the first electrode of the transistor to the first conductive layer.

In another aspect, the invention provides a method of forming a capacitor. The method includes the steps of providing a substrate carrying a first conductive layer; forming a first metal oxide layer overlying the first conductive layer, the first metal oxide layer being substoichiometric; defining a second metal oxide layer by exposing the first metal oxide layer to sulfur trioxide under reaction conditions effective to oxidize the first metal oxide layer; and forming a second conductive layer overlying the second metal oxide layer.

In a further aspect, the invention provides a method of increasing the oxygen content of a substoichiometric metal oxide layer. The method includes the steps of placing the substoichiometric metal oxide layer in a processing station; and exposing the substoichiometric metal oxide layer, while the substoichiometric metal oxide layer is in the processing station, to sulfur trioxide under reaction conditions effective to oxidize the substoichiometric metal oxide layer.

In yet another aspect, the invention provides a method of forming a selected metal oxide layer overlying a substrate. The method includes the steps of forming a first metal oxide layer having a first oxygen content overlying the substrate; and conditioning the first metal oxide layer with sulfur trioxide to define the selected metal oxide layer having a second oxygen content, wherein the second oxygen content is greater than the first oxygen content.

In still another aspect, the invention provides a method of forming a computer. The method includes the steps of providing a data input device; providing a data output device; providing computing circuitry coupled to the data input and output devices, the computing circuitry including a memory cell. The memory cell is formed by a method which includes the steps of providing a transistor on a first portion of a substrate, the transistor having a first electrode; forming a first conductive layer on a second portion of the substrate; forming a dielectric layer comprising substoichiometric tantalum pentoxide having a first oxygen content, the dielectric layer overlying the first conductive layer; conditioning the dielectric layer with sulfur trioxide to define a substantially stoichiometric tantalum pentoxide layer having a second oxygen content, wherein the second oxygen content is greater than the first oxygen content; forming a second conductive layer overlying the substantially stoichiometric tantalum pentoxide layer; and coupling the first electrode of the transistor to the first conductive layer.

In another aspect, the invention provides a composition that includes a metal oxide layer in contact with sulfur trioxide.

In preferred embodiments of the above aspects, the memory cell is a dynamic random access memory. The substrate may contain silicon. The first conductive layer may be formed, at least in part, of a material selected from a conductive metal, a conductive metal compound, and a conductive metal alloy. The first conductive layer may be formed, at least in part, of a material selected from platinum, ruthenium, palladium, iridium, rhenium, rhodium, gold, silver, ruthenium oxide, tin oxide, indium oxide, rhenium oxide, osmium oxide, rhodium oxide, iridium oxide, doped tin oxide, indium oxide, zinc oxide, $YBa_2Cu_3O_{7-x}$, $(La,Sr)$ $CoO_3$, and $SrRuO_3$. The dielectric layer may be formed by chemical vapor deposition or sputtering, among other possible techniques. The conditioning step may be performed at a temperature ranging from 100° to 600° C., at a pressure ranging from 0.1 to 10 atmospheres, for a time period of at least 10 minutes, typically 10 to 120 minutes. The stoichiometric tantalum pentoxide layer may have a thickness ranging from 5 to 200 Angstroms. The dielectric constant of the conditioned tantalum pentoxide layer typically ranges from 15–23. The second conductive layer may include a material selected from a conductive metal, a conductive metal compound, and a conductive metal alloy, where examples of these are provided above.

These and other aspects of the invention will be further described herein in connection with the following drawings and detailed description.

BRIEF DESCRIPTION OF THE DRAWINGS

FIG. 1 is a cross-sectional view illustrating a substrate with an overlying first conductive layer.

FIG. 2 is a cross-sectional view illustrating a substrate with an overlying first conductive layer and dielectric layer.

FIG. 3 is a flow chart depicting the conditioning process of the present invention.

FIG. 4 is a cross-sectional view illustrating a capacitor.

DETAILED DESCRIPTION OF THE INVENTION

The present invention is directed to oxidizing a metal oxide layer by contacting that layer with sulfur trioxide. This invention is based upon the surprising discovery that exposing a substoichiometric metal oxide layer to sulfur trioxide will reduce the layer's oxygen deficiency so as to provide a more highly oxidized metal oxide layer. This discovery has many useful applications in the electronics industry and other areas where the properties of a metal oxide layer are desirably improved by rendering the layer more highly oxidized.

As used herein, the term "metal oxide" has its standard meaning in the art, which is the oxide of metal. The metal of the metal oxide is one or more of the elements having an atomic number falling within the ranges 3–4, 11–14, 19–33, 37–51, and 55–84. Thus, the metal may be an alkaline metal, which falls within the first group of the Periodic Table of the Elements, or an alkaline earth metal which falls within the second group of the Periodic Table. In addition, the metal may be a rare earth metal, which has an atomic number falling within the range of 57 to 72. A preferred metal oxide contains a transition metal, which is a metal having an atomic number falling within the ranges 21–30, 39–48, and 71–80. Noble metals, which are metals of the gold and platinum families, are not preferred metals because they are not readily oxidized. The metal oxide layer may be formed from more than one metal, or in other words, may be a mixture of metal oxides.

As is recognized in the art, metals form stable oxides, i.e., metal reacts with oxygen to form thermodynamically stable oxygen-containing reaction products. In general, stable metal oxides may be represented by the formula $MO_x$, wherein "x" is a number greater than zero and typically less than 10, and "M" is one or more metals as identified above. In fact, for some metals, there may be several stable metal oxide species, i.e., several different values of "x" may each characterize a stable metal oxide. In general, the value(s) of "x" for a particular metal or set of metals will depend on a number of factors, including the oxidation state and electronic configuration of the metal(s). The term "stoichiometric metal oxide" will be used herein to refer to metal oxides having a value of "x" which provides for a thermodynamically stable metal oxide.

Metal oxides have been extensively studied for many years, and a large number of the metal oxide species which are stable under ambient conditions have been identified and catalogued. See, e.g., the CRC Handbook of Chemistry and Physics, CRC Press, Inc., Boca Raton Fla., and particularly the Table therein entitled "Thermodynamic Properties of the Oxides" (see, e.g., pages D-46–D49 in the 68th Edition, incorporated herein by reference), which is one convenient source of a listing of some metal oxides. Accordingly, stoichiometric metal oxides are well known to the art. Preferred metal oxides of the present invention are transition metal oxides, and tantalum pentoxide is a preferred transition metal oxide which may be conditioned by the present invention.

Exemplary stoichiometric metal oxides according to the present invention include, without limitation, $Ac_2O_3$, $Ag_2O$, $Ag_2O_2$, $Al_2O_3$, $Am_2O_3$, $AmO_2$, $As_2O_3$, $AsO_2$, $As_2O_5$, $Au_2O_3$, $Ba_2O$, $BaO$, $BaO_2$, $BeO$, $BiO$, $Bi_2O_3$, $CaO$, $CdO$, $Ce_2O_3$, $CeO_2$, $CoO$, $Co_3O_4$, $Cr_2O_3$, $CrO_2$, $CrO_3$, $Cs_2O$, $Cs_2O_2$, $Cs_2O_3$, $Cu_2O$, $CuO$, $FeO$, $Fe_3O_4$, $Fe_2O_3$, $Ga_2O$, $Ga_2O_3$, $GeO$, $GeO_2$, $HfO_2$, $Hg_2O$, $HgO$, $In_2O$, $InO$, $In_2O_3$, $Ir_2O_3$, $IrO_2$, $K_2O_3$, $KO_2$, $La_2O_3$, $Li_2O$, $Li_2O_2$, $MgO$, $MgO_2$, $MnO$, $Mn_3O_4$, $Mn_2O_3$, $MnO_2$, $MoO_2$, $MoO_3$, $Na_2O$, $Na_2O_2$, $NaO_2$, $NbO$, $NbO_2$, $Nb_2O_5$, $Nd_2O_3$, $NiO$, $NpO_2$, $Np_2O_5$, $OsO_2$, $OsO_4$, $PaO_2$, $Pa_2O_5$, $PbO$, $Pb_3O_4$, $PbO_2$, $PdO$, $PoO_2$, $Pr_2O_3$, $PrO_2$, $PtO$, $Pt_3O_4$, $PtO_2$, $PuO$, $Pu_2O_3$, $PuO_2$, $RaO$, $Rb_2O$, $Rb_2O_2$, $Rb_2O_3$, $RbO_2$, $ReO_2$, $ReO_2$, $ReO_3$, $Re_2O_7$, $ReO_4$, $Rh_2O$, $RhO$, $Rh_2O_3$, $RuO_2$, $RuO_4$, $Sb_2O_3$, $SbO_3$, $Sb_2O_3$, $Sc_2O_3$, $SeO$, $SeO_2$, $Sm_2O_3$, $SnO$, $SnO_2$, $SrO$, $SrO_2$, $Ta_2O_5$, $TcO_2$, $TcO_3$, $Tc_2O_7$, $TeO$, $TeO_2$, $ThO$, $ThO_2$, $TiO$, $Ti_2O_2$, $Ti_5O_5$, $TiO_2$, $Ti_2O$, $Ti_2O_3$, $UO$, $UO_2$, $U_3O_3$, $UO_2$, $VO$, $V_2O_3$, $V_2O_5$, $VO_2$, $V_2O_5$, $VO_2$, $WO_3$, $Y_2O_3$, $ZnO$, and $Zro_2$.

The stoichiometric metal oxide of the present invention may be a mineral. Suitable minerals include, without limitation, braunite, $Mn_2O_3$; cassiterite, $SnO_2$; cuprite, $Cu_2O$; hollandite, $(Ba, Na, K)Mn_8O_{16}$; limenite, $FeTiO_3$; magnetite, $Fe_3O_4$; manganite, $MnO.OH$; melaconite, $CuO$; psilomelane, $KMnO.MnO_2$; pyrolusite, $MnO_2$; rutile, $TiO_2$; and uraninite, $UO$.

As seen by the above examples of metal oxides, for a given metal, certain ratios of metal to oxygen are particularly stable. For example, cerium forms both $Ce_2O_3$ (having an oxygen:metal ratio of 3:2, i.e., "x" is 1.5) and $CeO_2$ (having a oxygen:metal ratio of 2:1, i.e., "x" is 2) as stable oxide species, while manganese forms $MnO$, $Mn_3O_4$, $Mn_2O_3$ and $MnO_2$, and tantalum forms $Ta_2O_5$. When a metal oxide has a oxygen:metal ratio equal to one of these stable ratios, then that metal oxide will be referred to herein as being a stoichiometric metal oxide.

During the preparation of a metal oxide layer by conventional techniques, it often happens that the layer contains less oxygen (more metal) than does an exactly stoichiometric metal oxide layer. For example, a metal oxide layer which is formed largely of $Ta_2O_5$, which is a preferred metal oxide layer of the present invention, may additionally contain some unoxidized tantalum metal ($Ta°$), so that the ratio of oxygen atoms to tantalum atoms in the layer is less than that in a stoichiometric $Ta_2O_5$ metal oxide layer. A metal oxide layer wherein the oxygen:metal ratio is less than would be present in a layer formed entirely of stoichiometric metal oxides will be referred to herein as a substoichiometric metal oxide layer. Thus, using tantalum as an example, when the ratio of oxygen:tantalum in a tantalum oxide layer is less than 5:2, i.e., less than 2.5, then that layer is a substoichiometric tantalum oxide layer. In other words, the term "stoichiometric," as used herein expresses the numerical relationship between metal and oxygen atoms in a fully oxidized metal oxide layer, whereas the term "substoichiometric" expresses the same relationship but where the metal oxide layer is not fully oxidized (i.e., is oxygen deficient).

The present invention provides a method of introducing oxygen into a metal oxide layer. Thus, the present invention may be used to convert a substoichiometric metal oxide layer into a more highly oxygen-containing form, i.e., a more highly oxidized form having a greater oxygen content. That "more highly oxidized" form is preferably a stoichiometric metal oxide layer. However, it is typically the case that the performance properties of a metal oxide layer improve as the oxygen content of the layer increases, so that even if the metal oxide layer does not become exactly stoichiometric after being conditioned according to the present invention, any increase in oxygen content of the layer that is provided by the present invention will typically be desirable.

Thus, the present invention provides for the oxidation of a metal oxide layer, preferably to a stoichiometric state. The invention also provides for the oxidation of a metal oxide layer to an essentially stoichiometric state, where an "essentially stoichiometric" layer falls somewhat short of having an exactly stoichiometric content of oxygen and metal, however the stoichiometry is sufficiently close to being stoichiometric that for purposes of the application of interest, the important performance properties of the essentially stoichiometric metal oxide layer are practically the same as the performance properties of a stoichiometric metal oxide layer.

The present invention is particularly suited for the manufacture of capacitors. In the electronics industry, a fundamental component of many devices is a capacitor. For instance, semiconductor chips typically incorporate many capacitors on a chip. A fundamental component of a capacitor is a dielectric layer, where an ideal dielectric layer is completely non-conductive of electrons. Typically, a capacitor has improved electrical properties when the dielectric layer thereof contains exactly or essentially stoichiometric metal oxide(s), as opposed to being a substoichiometric metal oxide layer. That is, a more highly oxidized metal oxide dielectric layer typically imparts to a capacitor the desirable properties of increased breakdown voltage, and decreased leakage current.

As used herein, the term "breakdown voltage" means the voltage at which an electrical breakdown occurs in a dielectric. The term "leakage current" means the gradual escape of current through a dielectric layer in a capacitor. Furthermore, the term "dielectric constant" means the ratio of the capacitance of a capacitor filled with a given dielectric to that of the same capacitor having only a vacuum as the dielectric. Thus, these terms have their standard meanings as employed in the art.

Thus, in one aspect, the present invention provides a method of forming a capacitor. The method includes the steps of providing a substrate carrying a first conductive layer; forming a metal oxide layer overlying the first conductive layer, where the metal oxide layer is substoichiometric; exposing the metal oxide layer to sulfur trioxide under reaction conditions effective to oxidize the metal oxide layer and thereby define a dielectric layer, which may also be referred to as a second metal oxide layer; and forming a second conductive layer overlying the dielectric layer. This process is illustrated in FIG. 1.

Referring now to FIG. 1, there is shown a substrate 10 carrying a first conductive layer 12. The substrate 10 is formed, at least in part, of a suitable semiconductor material. A preferred semiconductor material is silicon and oxides thereof. However, the substrate 10 may contain other single component semiconductors including, without limitation, germanium, diamond, or the like, or may contain compound semiconductors including, without limitation, gallium arsenide, gallium nitride, indium phosphide, silicon germanium, silicon carbide, or the like.

The substrate 10 carries a first conductive layer 12. The term "carry" means that the conductive layer 12 is above and in direct (as shown in FIG. 1) or indirect connection with the substrate 10. The first conductive layer 12 is formed, at least in part, from a conductive material. Suitable conductive materials include, without limitation, conductive metals, conductive metal compounds, and conductive metal alloys. For example, the first conductive layer 12 may be formed, at least in part, from any of platinum, ruthenium, palladium, iridium, rhenium, rhodium, gold, silver, ruthenium oxide, tin oxide, indium oxide, rhenium oxide, osmium oxide, rhodium oxide, iridium oxide, doped tin oxide, indium oxide, zinc oxide, $YBa_2Cu_3O_{7-x}$, $(La,Sr)CoO_3$, or $SrRuO_3$, where these chemical species are exemplary of possible materials which may form the first conductive layer 12.

The first conductive layer 12 may be formed to overlie the substrate 10 by conventional techniques such as by chemical vapor deposition (CVD) or sputtering.

As stated above, the first conductive layer 12 is not necessarily in direct contact with the substrate 10 as shown in FIG. 1. For example, one or more barrier layers (not shown) may be interposed between substrate 10 and first conductive layer 12. The barrier layer may be useful in situations where it is desirable to prevent or inhibit diffusion of the substrate material into the overlying conductive layer. Such barrier layers are known in the art, and may be formed from, for example, titanium nitride and/or tantalum nitride.

Referring now to FIG. 2, there is shown a metal oxide layer 14 overlying first conductive layer 12 and substrate 10. The metal oxide layer 14 is formed, at least in part, of a substoichiometric metal oxide. The metal oxide layer 14 may be an oxide of a metal as discussed above. In one embodiment of this invention, the dielectric layer 14 comprises tantalum and oxides thereof, wherein the ratio of oxygen to tantalum is less than 2.5, that is, the dielectric layer is substoichiometric tantalum pentoxide. However, any metal oxide as defined above (or as listed in the CRC Handbook referred to above) may be present in the metal oxide layer 14.

The metal oxide layer 14 may be formed to overlie first conductive layer 12 by conventional techniques such as by chemical vapor deposition (CVD) or by sputtering. Both of these techniques, however, typically result in a metal oxide layer 14 which is oxygen deficient compared to a stoichiometric layer, and hence provide for a substoichiometric metal oxide layer. In order to achieve a more nearly stoichiometric dielectric layer for a capacitor, the present invention provides that metal oxide layer 14 is exposed to sulfur trioxide gas in a conditioning process.

The term "conditioning" is commonly used in the art to refer to a process of treating a substance or material in order to improve the properties thereof, and that term is used herein in the same sense. Thus, the present invention includes the conditioning of a metal oxide layer, where the conditioning process includes the step of exposing the metal oxide layer to sulfur trioxide under reaction conditions effective to oxidize the metal layer, i.e., to increase the oxygen to metal ratio in the metal oxide layer, which will typically provide for an improved dielectric layer.

The sulfur trioxide is preferably in the gas form when it is contacted with the metal oxide layer. During storage, and prior to being used in a conditioning process of the invention, the sulfur trioxide may exist in a non-gaseous form. Non-gaseous sulfur trioxide exists in several different forms, any of which are a suitable storage form for the practice of the present invention. Most typically, sulfur trioxide is in the so-called "gamma-form", with a melting point of 16.8° C. (62.2° F.). A small amount of inhibitor (stabilizer) may be present in this liquid gamma-form sulfur trioxide, where the inhibitor minimizes the formation of the higher melting beta—(m.p. 32.5° C.) and alpha—(m.p. 62.3° C.) forms of sulfur trioxide. Gamma-form sulfur trioxide containing inhibitor is commercially available from, e.g., Air Products, Allentown, Pa. Even if the sulfur trioxide has a melting point of greater than 16.8° C., the sulfur trioxide may be converted into a gaseous state by the application of sufficient heat.

The conditioning process may be advantageously employed in either batch or continuous operation modes. In the continuous operation mode, regulated quantities of sulfur trioxide gas are dispensed, continuously or at appropriate intervals (bursts), into a processing station. In one exemplary embodiment, the processing station is a chemical vapor deposition (CVD) chamber, wherein the substoichiometric metal oxide layer was initially formed. The processing station houses substrate 10 with its overlying conductive layer 12 and metal oxide layer 14. More specifically, the conditioning process of the present invention is performed in accordance with the steps illustrated in the flowchart of FIG. 3.

Referring now to the flowchart of FIG. 3, a processing station containing substrate 10 with its overlying conductive layer 12 and metal oxide layer 14 (refer to FIGS. 1 and 2) is provided in step 15. The conditioning process of the invention is performed in the processing station. The term "processing station" simply refers to an apparatus which allows for the metal oxide layer to be contacted with sulfur trioxide. The processing station may be a "static" chamber, wherein the metal oxide layer is placed and contacted with a suitable concentration of sulfur trioxide. This static chamber is closed so that no sulfur trioxide can escape. Alternatively, the processing chamber may include a conveyor belt, wherein structures having metal oxide layers are passed through an environment having an atmosphere enriched in sulfur trioxide. Preferably, the processing station allows for the control of the time, temperature and concentration of sulfur trioxide to which the metal oxide layer is exposed.

In general, the processing station should be free of moisture, so that the sulfur trioxide will not react with the moisture and thereby form sulfuric acid. Thus, in a "static" processing station, the chamber of the station is preferably purged with dry nitrogen gas while the walls of the processing station are maintained at an elevated temperature of approximately 100° C. This step minimizes the moisture level in the processing station, thereby avoiding the unwanted formation of sulfuric acid ($H_2SO_4$) which may occur when sulfur trioxide contacts water. The conditioning with the sulfur trioxide gas to substantially oxidize the first metal oxide layer occurs next.

Referring again to FIG. 3, the processing station is closed, i.e., an internal chamber of the processing station is isolated from the atmosphere in the surrounding environment, in step 16. The processing station, in step 18, is purged with dry nitrogen gas while the walls of the processing station are maintained at an elevated temperature of approximately 100° C. Step 18 minimizes the moisture level in the processing station, thereby avoiding the unwanted formation of sulfuric acid ($H_2SO_4$) which may occur when sulfur trioxide contacts water. The conditioning of metal oxide layer 14 with the sulfur trioxide gas occurs in step 20.

In step 20, the metal oxide layer 14 is exposed to sulfur trioxide under reaction conditions effective to oxidize the layer 14. Thus, the pressure of the sulfur trioxide gas, the internal temperature of the processing station, and the time of exposure of layer 14 to sulfur trioxide are selected in order to provide a conditioning environment effective to oxidize the layer 14. The precise reaction conditions to employ in the conditioning step will depend, at least in part, on the degree to which the metal oxide layer is substoichiometric, the extent to which the layer is desirably oxidized, the thickness of the layer, and the particular composition of the layer. Some metal oxides are more amenable to oxidation than others.

Thus, the conditions needed to oxidize metal oxide layer 14 (refer to FIGS. 1 and 2) will depend, in large part, upon the thickness of layer 14. However, typical dielectric layers in a capacitor have a thickness ranging from about 5 to about 200 Angstroms, and for metal oxide layers having a thickness falling within this range, the preferred operating parameters for step 20 are as follows: the pressure of the sulfur trioxide gas is adjusted to between 0.1 to 10 atmospheres; the temperature within the processing station is adjusted to between 100° C. to 600° C.; and the time of exposure, given this pressure and temperature, is at least about 10 minutes and typically between about 10 and about 120 minutes.

It is to be noted that increasing either or both of the pressure or temperature will generally decrease the amount of time needed to oxidize the metal oxide layer 14. However, if the temperature is too high, that high temperature may damage other structures which are also within the processing chamber. Also, as the desired pressure is increased, it is typically necessary to reinforce the processing station so that it can withstand the increased pressure. This reinforcing step typically is expensive, and may become commercially unacceptable at some point.

It may not be necessary to completely oxidize the layer in order to obtain the desired performance properties. It may be sufficient that the surface of the layer 14 is oxidized to some extent, preferably to a stoichiometric or essentially stoichiometric state, while the interior of the layer remains substoichiometric or may even be entirely unaffected by the conditioning process. Such a "bilayer" structure may afford all of the properties that are desired in a dielectric layer of a capacitor.

Finally, after the sulfur trioxide conditioning process of step 20 has been completed, the processing station is allowed to cool to approximately room temperature in step 22. Following this process, the first metal oxide layer 14 is converted to a dielectric layer 14' as shown in FIG. 4. This dielectric layer 14' serves as a (the) dielectric layer of the capacitor.

In order to complete formation of a capacitor, a second conductive layer 24 is formed overlying the dielectric layer 14'. Referring now to FIG. 4, there is shown a second conductive layer 24 overlying dielectric layer 14', first conductive layer 12, and substrate 10. The second conductive layer 24 comprises a suitable conductive material such as a conductive metal, a conductive metal compound, or a conductive metal alloy. For example, and without limitation, the second conductive layer 24 may be formed from one or more of platinum, palladium, ruthenium, rhodium, gold, iridium, silver, titanium nitride, ruthenium nitride, tin nitride, zirconium nitride, tungsten nitride, ruthenium dioxide, tin oxide, zinc oxide, doped zinc oxide, iridium oxide, titanium silicide, tantalum silicide, tungsten silicide, molybdenum silicide, nickel silicide, tantalum carbide, titanium boride, tantalum titanium molybdenum, tungsten, aluminum, doped silicon, or doped germanium.

The second conductive layer 24 may be formed by conventional techniques such as by chemical vapor deposition (CVD) or by sputtering. In combination, second conductive layer 24, dielectric layer 14', and first conductive layer 12 form a capacitor useful in semiconductor devices such as dynamic random access memories (DRAMs).

According to the present invention, the dielectric layer 14' has a lower leakage current and higher oxygen content than it had before the conditioning process of step 20. When the dielectric layer 14' is substantially stoichiometric tantalum pentoxide, its dielectric constant typically falls within the range of 15 to 23 after the conditioning process of step 20.

In another aspect, the present invention provides a method of increasing the oxygen content of a substoichiometric metal oxide layer. In this aspect, a substoichiometric metal oxide layer is placed within a processing station; and while in the processing station, the substoichiometric metal oxide layer is exposed to sulfur trioxide under reaction conditions effective to oxidize the substoichiometric metal oxide layer.

In this aspect, the substoichiometric metal oxide layer may be formed by any technique, where chemical vapor deposition (CVD) and sputtering are suitable and commonly used techniques in the electronics industry. The metal oxide layer may be formed from any one or more of the metal oxides described above. The metal oxide layer may be substoichiometric to any degree, and still be suitable for use in the inventive method. In one exemplary embodiment, the substoichiometric metal oxide layer is substoichiometric tantalum pentoxide and the processing station is a chemical vapor deposition (CVD) chamber. The conditioning step may be performed as described above, i.e., under reaction conditions of time, temperature, pressure etc. that have been described above.

The leakage current of a capacitor may be measured by well-known techniques. For example, a voltage may be applied to a capacitor and the leakage of that voltage subsequently measured. The dielectric constant of a metal oxide layer may also be measured by well known techniques. Typically, a capacitor is prepared from the dielectric, where the dielectric has a known thickness and area, and the capacitance of the capacitor is measured. The dielectric constant $\kappa$, is then calculated according to the equation: $C=\kappa\epsilon_o A/d$, where C is the capacitance of the capacitor, $\kappa$ is the dielectric constant of the dielectric layer, $\epsilon_o$ is a constant equal to $8.85\times10^{-12}$ Farads/meter (F/m), A is the area of the dielectric layer (square meters, $m^2$), and d is the thickness of the dielectric layer (meters, m).

In another aspect, the present invention provides a method of forming a selected metal oxide layer overlying a substrate. In this aspect, a metal oxide layer having a first oxygen content is formed overlying a substrate. The metal oxide layer is then conditioned with sulfur trioxide to provide a metal oxide layer having a second oxygen content, where the second oxygen content is greater than the first oxygen content. Thus, the conditioning process provides for a metal oxide layer having an oxygen content which is greater than that of the pre-conditioned metal oxide layer.

In this further aspect, the substrate may be metal or non-metal, where exemplary non-metals include glasses and organic polymers. A preferred substrate is silicon having a first conductive layer thereon. The metal oxide layer may be formed from any of the metal oxides disclosed above, where an oxide of a transition metal, and more particularly tantalum pentoxide are preferred metal oxides. The metal oxide layer is preferably substoichiometric in oxygen content.

The oxygen content of a metal oxide layer, by which is meant the relative amounts of oxygen and metal present in the metal oxide layer, can be determined by any of several well known techniques. For example, the metal oxide layer may be ground into a powder, and this powder analyzed for atomic content by a suitable analytical technique. Alternatively, solid films on wafers may be analyzed. Suitable analytical techniques for measuring oxygen content include, for example, total x-ray fluorescence, secondary ion mass spectroscopy, x-ray photoelectron spectroscopy and Auger spectroscopy.

In a further aspect, the invention provides a method of forming a memory cell. In general, a memory cell requires a transistor on a first portion of a substrate and a capacitor having a dielectric layer on a second portion of the substrate. A memory cell is formed by coupling a first electrode of the transistor to a first conductive layer of the capacitor. The method according to the present invention includes the steps of: providing a substrate having a transistor on a first portion of the substrate, the transistor having a first electrode, and a first conductive layer on a second portion of the substrate; forming a dielectric layer formed, at least id part, of substoichiometric metal oxide having a first oxygen content, the dielectric layer overlying the first conductive layer; conditioning the metal oxide layer with sulfur trioxide to provide a more highly oxidized metal oxide layer having a second oxygen content, wherein the second oxygen content is greater than the first oxygen content; forming a second conductive layer overlying the more highly oxidized metal oxide layer having a second oxygen content, and coupling the first electrode of the transistor to the first conductive layer.

In this aspect, a preferred metal oxide is tantalum pentoxide. The memory cell is preferably a dynamic random access memory (DRAM). With the exception of the conditioning process, the steps of this aspect of the invention are well known in the art of memory cell manufacture. Accordingly, the method may be practiced by one of ordinary skill in the art in view of known manufacturing methods and the discussion contained herein directed to conducting a conditioning process with sulfur trioxide.

In a further aspect, the present invention provides a composition comprising a metal oxide layer in contact with sulfur trioxide. In this aspect, the novel composition is metal oxide in contact with sulfur trioxide. The composition may be prepared as described above, and is a useful intermediate composition in the preparation of a highly oxidized metal oxide layer according to the present invention. The composition is preferably at a temperature ranging from 100° to 600° C., and the sulfur trioxide is preferably in contact with the metal oxide layer as a gas at a pressure ranging from 0.1 to 10 atmospheres. The metal oxide layer preferably has a thickness ranging from 5 to 200 Å, and is preferably formed, at least in part, of tantalum pentoxide.

In yet another aspect, the invention provides a method of forming a computer. The method includes the step of: providing a data input device; providing a data output device; providing computing circuitry coupled to the data input and output devices, the computing circuitry including a memory cell. The memory cell is formed by steps including: providing a transistor on a first portion of a substrate, the transistor having a first electrode; forming a first conductive layer on a second portion of the substrate; forming a dielectric layer comprising substoichiometric tantalum pentoxide having a first leakage current, the dielectric layer overlying the first conductive layer; conditioning the dielectric layer with sulfur trioxide to define a substantially stoichiometric tantalum pentoxide layer having a second leakage current, wherein the second leakage current is less than the first leakage current; forming a second conductive layer overlying the stoichiometric tantalum pentoxide layer; and coupling the first electrode of the transistor to the first conductive layer.

Thousands of computers are manufactured and sold each year in the United States, and the data input device, data output device, and computing circuitry excluding the memory cell prepared by the present invention, as well as methods for coupling same are well known in the art.

From the foregoing it will be appreciated that, although specific aspects and embodiments of the invention have been described herein for purposes of illustration, various modifications may be made without deviating from the spirit and scope of the invention. It is to be further understood that the drawings are illustrative and symbolic of exemplary aspects and embodiments of the present invention, and there is no intention to indicate scale or relative proportions of the elements shown therein. Accordingly, the invention is not limited except as by the appended claims.

I claim:

1. An article that includes a composition comprising sulfur trioxide in contact with a metal oxide layer selected from the group consisting of $Ac_2O_3$, $Ag_2O$, $Ag_2O_2$, $Am_2O_3$, $AmO_2$, $As_2O_3$, $AsO_2$, $As_2O_5$, $Au_2O_3$, $Ba_2O$, $BiO$, $CdO$, $Ce_2O_3$, $CeO_2$, $CoO$, $Co_3O_4$, $CrO_2$, $CrO_3$, $Cs_2O$, $Cs_2O_2$, $Cs_2O_3$, $Cu_2O$, $CuO$, $FeO$, $Fe_3O_4$, $Fe_2O_3$, $Ga_2O$, $Ga_2O_3$, $GeO$, $GeO_2$, $Hg_2O$, $HgO$, $In_2O$, $InO$, $In_2O_3$, $Ir_2O_3$, $IrO_2$, $K_2O_3$, $KO_2$, $Li_2O$, $Li_2O_2$, $MgO_2$, $Mn_3O_4$, $Mn_2O_3$, $MnO_2$, $MoO_2$, $MoO_3$, $Na_2O$, $Na_2O_2$, $NaO_2$, $NbO$, $NbO_2$, $Nb_2O_5$, $Nd_2O_3$, $NiO$, $NpO_2$, $Np_2O_5$, $OsO_2$, $OsO_4$, $PaO_2$, $Pa_2O_5$, $PbO$, $Pb_3O_4$, $PbO_2$, $PdO$, $PoO_2$, $Pr_2O_3$, $PrO_2$, $PtO$, $Pt_3O_4$, $PtO_2$, $PuO$, $Pu_2O_3$, $PuO_2$, $RaO$, $Rb_2O$, $Rb_2O_2$, $Rb_2O_3$, $RbO_2$, $ReO_2$, $ReO_2$, $ReO_3$, $Re_3O_7$, $ReO_4$, $Rh_2O$, $RhO$, $Rh_2O_3$, $RuO_2$, $RuO_4$, $Sb_2O_3$, $SbO_3$, $Sb_2O_5$, $Sc_2O_3$, $SeO$, $SeO_2$, $Sm_2O_3$, $SrO_2$, substoichemetric tantalum oxide, $TcO_2$, $TcO_3$, $Tc_2O_7$, $TeO$, $TeO_2$, $ThO$, $ThO_2$, $TiO$, $Ti_2O_2$, $Ti_5O_5$, $Ti_2O$, $Ti_2O_3$, $UO$, $UO_2$, $U_3O_3$, $UO_2$, $VO$, $V_2O_3$, $V_2O_5$, $VO_2$, $V_2O_5$, $VO_2$, and $ZnO$.

2. The article of claim 1 wherein the metal oxide layer is comprised of an alkaline metal oxide within the group.

3. The article of claim 1 wherein the metal oxide layer is comprised of an alkaline earth metal oxide within the group.

4. The article of claim 1 wherein the metal oxide layer is comprised of a rare earth metal oxide within the group.

5. The article of claim 1 wherein the metal oxide layer is comprised a transition metal oxide within the group.

6. The article of claim 1 wherein the metal oxide layer is comprised of substoichemetric tantalum oxide.

7. The article of claim 1 wherein the metal oxide layer has a thickness of 5 to 200 Angstroms.

8. The article of claim 7 wherein the metal oxide layer is comprised of substoichemetric oxide.

9. The article of claim 1 wherein the sulfur trioxide is gaseous sulfur trioxide.

10. The article of claim 9 contained under conditions of temperature ranging from 100° C. to 600° C.

11. The article of claim 9 wherein the metal oxide layer is disposed on a conductive layer.

12. The article of claim 11 wherein the conductive layer comprises a material selected from the group consisting of a conductive metal, a conductive metal compound, a conductive metal alloy, and a semiconductor.

13. The article of claim 11 wherein the conductive layer comprises a material selected from the group consisting of platinum, ruthenium, palladium, iridium, rhenium, rhodium, gold, silver, ruthenium oxide, tin oxide, indium oxide, rhenium oxide, osmium oxide, rhodium oxide, iridium oxide, doped tin oxide, indium oxide, zinc oxide, $YBa_2Cu_3O_{7-x}$, $(La,Sr)CoO_3$, and $SrRuO_3$.

14. The article of claim 11 wherein the conductive layer is disposed on a silicon substrate.

15. The article of claim 14 wherein the conductive layer comprises a material selected from the group consisting of: a conductive metal, a conductive metal compound, a conductive metal alloy, and a semiconductor.

16. The article of claim 14 wherein the conductive layer comprises a material selected from the group consisting of platinum, ruthenium, palladium, iridium, rhenium, rhodium, gold, silver, ruthenium oxide, tin oxide, indium oxide, rhenium oxide, osmium oxide, rhodium oxide, iridium oxide, doped tin oxide, indium oxide, zinc oxide, $YBa_2Cu_3O_{7-x}$, $(La,Sr)CoO_3$, and $SrRuO_3$.

17. The article of claim 1 wherein the metal oxide layer is comprised of substoichemetric tantalum oxide layer having a thickness of 5 to 200 Angstroms, wherein the sulfur trioxide is gaseous sulfur trioxide, wherein the substoichemetric tantalum oxide layer is disposed on a conductive layer and the conductive layer is disposed on a silicon substrate.

18. The article of claim 17 contained under conditions of temperature ranging from 100° C. to 600° C.

19. The article of claim 17 wherein the sulfur trioxide is gaseous sulfer trioxide.

20. The article of claim 17 wherein the conductive layer comprises a material selected from the group consisting of: a conductive metal, a conductive metal compound, a conductive metal alloy, and a semiconductor.

21. The article of claim 17 wherein the conductive layer comprises a material selected from the group consisting of platinum, ruthenium, palladium, iridium, rhenium, rhodium, gold, silver, ruthenium oxide, tin oxide, indium oxide, rhenium oxide, osmium oxide, rhodium oxide, iridium oxide, doped tin oxide, indium oxide, zinc oxide, $YBa_2Cu_3O_{7-x}$, $(La,Sr)CoO_3$, and $SrRuO_3$.

* * * * *

UNITED STATES PATENT AND TRADEMARK OFFICE
CERTIFICATE OF CORRECTION

PATENT NO.      : 6,896,969 B2
DATED           : May 24, 2005
INVENTOR(S)     : Alan R. Reinberg It is certified that error appears in the above-identified patent and that said Letters Patent is hereby corrected as shown below:

Column 2,
Lines 31 and 32, reads "low temperatures (i.e., approximately 400° C. and is therefore not damaging to the underlying polysilicon conductive" should read -- low temperatures (i.e., approximately 400° C and is therefore not damaging to the underlying polysilicon conductive --.

Column 4,
Line 4, reads "a temperature ranging from 100° to 600° C. at a pressure" should read -- a temperature ranging from 100° to 600° C at a pressure --.

Column 5,
Line 37, reads "$V_2O_3$, $V_2O_5$, $VO_2$, $V_2O_5$, $VO_2$, $WO_3$, $Y_2O_3$, ZnO, and $Zro_2$" should read -- $V_2O_3$, $V_2O_5$, $VO_2$, $V_2O_5$, $VO_2$, $WO_3$, $Y_2O_3$, ZnO, and $ZrO_2$ --.

Column 8,
Line 15, reads "point of 16.8° C. (62.2° F.). A small amount of inhibitor" should read -- point of 16.8° C (62.2° F). A small amount of inhibitor --.
Line 18, reads "higher melting beta- (m.p. 32.5° C.) and alpha- (m.p." should read -- higher melting beta- (m.p. 32.5° C) and alpha- (m.p. --.
Line 19, reads "62.3° C. forms of sulfur trioxide. Gamma-form sulfur" should read -- 62.3° C forms of sulfur trioxide. Gamma-form sulfur --.
Line 22, reads "has a melting point of greater than 16.8° C., the sulfur" should read -- has a melting point of greater than 16.8° C, the sulfur --.

Column 9,
Line 34, reads "between 100° C. to 600° C.; and the time of exposure, given" should read -- between 100° C to 600° C; and the time of exposure, given --.

Column 11,
Line 63, reads "600° C. and the sulfur trioxide is preferably in contact with" should read -- 600° C and the sulfur trioxide is preferably in contact with --.

UNITED STATES PATENT AND TRADEMARK OFFICE
CERTIFICATE OF CORRECTION

PATENT NO. : 6,896,969, B2
DATED : May 24, 2005
INVENTOR(S) : Alan R. Reinberg

It is certified that error appears in the above-identified patent and that said Letters Patent is hereby corrected as shown below:

Column 12,
Line 53, reads "$V_2O_5$, $VO_2$ and ZnO" should read -- $VaO_5$, $VO_2$, and ZnO --.
Line 63, reads "comprised of substoichemetric tantalum oxide." should read -- comprised of substoichiometric tantalum oxide. --.
Line 67, reads "comprised of substoichemetric oxide." should read -- comprised of substoichiometric oxide. --.

Column 13,
Line 4, reads "temperature ranging from 100° C. to 600° C." should read -- temperature ranging from 100° C to 600° C. --.

Column 14,
Lines 5 and 6, reads "is comprised of substoichemetric tantalum oxide layer having a thickness of 5 to 200 Angstroms, wherein the sulfur" should read -- is comprised of substoichiometric tantalum oxide layer having a thickness of 5 to 200 Angstroms, wherein the sulfur --.
Lines 7 and 8, reads "trioxide is gaseous sulfur trioxide, wherein the substoichemetric tantalum oxide layer is disposed on a conductive" should read -- trioxide is gaseous sulfur trioxide, wherein the substoichiometric tantalum oxide layer is disposed on a conductive --.

Signed and Sealed this

Twenty-eighth Day of March, 2006

JON W. DUDAS
*Director of the United States Patent and Trademark Office*